(12) United States Patent
Levitt et al.

(10) Patent No.: US 11,810,763 B2
(45) Date of Patent: Nov. 7, 2023

(54) DISTRIBUTED GROUND SINGLE ANTENNA ION SOURCE

(71) Applicant: Schlumberger Technology Corporation, Sugar Land, TX (US)

(72) Inventors: Benjamin Levitt, Boston, MA (US); Brian Munroe, Cambridge, MA (US)

(73) Assignee: SCHLUMBERGER TECHNOLOGY CORPORATION, Sugar Land, TX (US)

(*) Notice: Subject to any disclaimer, the term of this patent is extended or adjusted under 35 U.S.C. 154(b) by 138 days.

(21) Appl. No.: 17/148,238

(22) Filed: Jan. 13, 2021

(65) Prior Publication Data

US 2022/0223376 A1 Jul. 14, 2022

(51) Int. Cl.
*H01J 37/32* (2006.01)

(52) U.S. Cl.
CPC ..... *H01J 37/3222* (2013.01); *H01J 2237/047* (2013.01)

(58) Field of Classification Search
CPC ............ H01J 37/3222; H01J 2237/047; H01J 2237/0473; H01J 2237/04732; H01J 2237/0475; H01J 2237/04753; H01J 37/08; H05H 7/08; H05H 3/06; H05H 2007/082; H05H 2007/027; H05H 1/02; H05H 1/14; H05H 1/18
See application file for complete search history.

(56) References Cited

U.S. PATENT DOCUMENTS

| | | | |
|---|---|---|---|
| 5,293,410 A | 3/1994 | Chen et al. | |
| 6,870,894 B2 | 3/2005 | Leung et al. | |
| 6,907,097 B2* | 6/2005 | Leung | G21B 3/00 376/110 |
| 8,039,772 B2 | 10/2011 | Lee et al. | |
| 9,706,635 B2 | 7/2017 | Jevtic et al. | |
| 10,522,315 B2 | 12/2019 | Evitt et al. | |
| 2002/0180364 A1 | 12/2002 | Ratzinger et al. | |
| 2006/0140326 A1* | 6/2006 | Rowland | H05H 3/06 376/114 |
| 2007/0095823 A1* | 5/2007 | Sedlmayr | H05B 6/72 219/688 |
| 2009/0230314 A1* | 9/2009 | Leung | G01V 5/0091 378/141 |
| 2010/0290575 A1* | 11/2010 | Rosenthal | H01J 27/18 376/112 |
| 2011/0176648 A1* | 7/2011 | Rowland | H05H 3/06 376/114 |
| 2019/0080873 A1* | 3/2019 | Levitt | H01J 27/18 |

OTHER PUBLICATIONS

Sortais, et al., "Ultracompact/ultralow power electron cyclotron resonance ion source for multipurpose application", Review of Scientific Instruments, 2010, vol. 81, 02B314, 4 pages.
Song, et al., "A compact microwave ion source with permanent magnet", Review of Scientific Instruments, 1992, vol. 63, pp. 2553-2555.

(Continued)

*Primary Examiner* — Haissa Philogene
(74) *Attorney, Agent, or Firm* — Frederick Carbone

(57) ABSTRACT

Embodiments presented provide for a distributed ground single antenna ion source used in scientific experimentation.

19 Claims, 6 Drawing Sheets

(56) References Cited

OTHER PUBLICATIONS

Ishikawa, et al., "Axial magnetic field extraction-type microwave ion source with a permanent magnet", Review of Scientific Instruments, 1984, vol. 55, pp. 449-456.
Waldmann, et al., "Measurements of beam current density and proton fraction of a permanent-magnet microwave ion source", Rev. Sci. Inst, 2011, vol. 82, 113505, 6 pages.
International Search Report and Written Opinion of PCT Application PCT/US2022/012281 dated Sep. 21, 2022, 11 pages.

* cited by examiner

DISTRIBUTED GROUND SINGLE ANTENNA ION SOURCE

CROSS-REFERENCE TO RELATED APPLICATIONS

None.

FIELD OF THE DISCLOSURE

Aspects of the disclosure relate to ion sources used in scientific experimentation. More specifically, aspects of the disclosure relate to a distributed ground single antenna ion source, wherein embodiments of the disclosure may be used to aid in hydrocarbon recovery operations.

BACKGROUND

The use of generators for the production of high energy neutrons has been an integral part of oil field service operations for years. The generation of high energy neutrons may be used to determine different features of geological formations in attempts to recover hydrocarbons locked within these formations. For example, high energy neutrons may be used in operations that involve a logging component, wherein the high energy neutrons bombard a portion of a formation and resulting spectra are gathered. Analysis of the spectra can provide information related to different physical aspects of the formation.

Conventionally, there are two methods to producing neutrons. A first method is to chemically produce the neutrons. Chemically producing neutrons can involve the use of different exotic chemicals. A second method includes using a device called a neutron generator to produce the neutrons. A neutron generator has a number of advantages compared with chemical neutron sources. A first advantage to the neutron generator is that the neutron generator features a negligible amount of radiation other than the desired neutrons. A second advantage is that the neutron generator produces a high yield of neutrons. A third advantage is the neutron generator produces a controllable yield of neutrons in bursts or continuously. The neutron generator furthermore produces neutrons at higher energies than formerly possible with chemical production techniques. Neutron generators may also be created such that they produce mono-energetic neutrons. Lastly, neutron generators may be created to provide superior control of the generator so as to permit its deactivation prior to withdrawal from or insertion in a well. While there are several advantages to such neutron generators, conventional neutron generators have drawbacks.

Neutron generators used in oil field service tools may require controlled low pressure atmospheres and high intensity magnetic fields. Such low pressure requirements and high intensity magnetic fields may be difficult to control in field testing situations.

Conventional neutron generators provide different components in order to produce the amount of neutrons necessary for surveying capabilities. These components include:

1) a gas source such as deuterium or tritium.
2) an ion source; and
3) an accelerating gap configured to guide ions generated to a target.

In embodiments, the ion source, listed as element 2 above, may have different types of constructions. One general type of construction may be comprised of at least one cathode and an anode. The ion source may be operated to generate ions of a desired type. To produce ions, in embodiments, an electrical impulse is applied to the anode. The impulse may be a specified voltage for a specified time, in one non-limiting embodiment. After the creation of the electrical impulse, electrons are emitted from the cathode surface. These electrons impact the primary electrons on the gas molecules from the gas source, listed above as element 1. This impact results in subsequent secondary electrons being stripped from the gas molecules. This, in turn, generates positively charged ions.

The accelerating gap, listed as element 3 above, is configured to allow ions, that are produced in the above reaction, to be accelerated and directed to a target. Embodiments of the disclosure accelerate and direct the ions to a target with sufficient energy such that the energy of the ions colliding with deuterium or tritium target nuclei generates a reaction.

In embodiments, negative electrons and positively charged ions are produced through electron and uncharged gas molecule collisions within the ion source. Electrodes that have different potentials contribute to ion production by accelerating electrons. These accelerated electrons may have an energy level that is higher than an ionization threshold. These energetic electrons collide with gas molecules to produce both additional ions and electrons. At the same time, some electrons and ions are lost to the anode and cathode. Through this process of production and loss, the positive and negative charges inside the ion source approach an equilibrium.

In order to increase the overall efficiency of an ion generating apparatus, it is desired to enhance the collision efficiency produced within the apparatus. Several different techniques can be used to increase the collision efficiency of an ion generating apparatus. In one such technique, collision efficiency can be increased by lengthening the distance that the electrons travel within the ion source before they are neutralized by striking a positive electrode.

In another conventionally known technique that may be used to enhance the collision efficiency of an ion source, a magnetic field is established which is perpendicular to an electric field. The combined magnetic and electrical fields are created in such a way as to cause the electrons to travel along a non-linear path within the ion source. In one such embodiment, the non-linear path may be, for example, a helical path. This helical path substantially increases the distance traveled by the electrons within the ion source and thus enhances the collision efficiency of the device.

Conventional minitrons attempt to produce neutrons for various scientific reasons. One such minitron is known as a hot cathode minitron as shown in FIG. 2. Other embodiments of conventional minitrons are described in U.S. Pat. No. 5,293,410. Hot cathode minitrons achieve neutron production via the fusion reaction and ions are electrostatically accelerated into a target. These ions are produced in an ionizer region, which is bounded on one end by the cathode/grid and on the other by the extractor/dome screen. The minitron in this conventional arrangement is operated in a pulsed fashion. The pulsed operation is achieved by applying a burst of (positive) voltage to the grid to energize electrons from the cathode to ionization energies. These energized electrons will instantly ionize the neutral gas locally, producing thereby a burst of ions to be accelerated to the target.

An ionized region is different from a plasma region in the ion to neutral particle density (<<1%). This limits the number of ions available to be accelerated to create neutrons, i.e. the ion beam current. In addition, the monoatomic fraction of the ion beam created by electron collisions is only 5%, with most of the remainder being diatomic. Since the mass of the diatomic ion is double that of the monoatomic ion, it is accelerated to only half the energy (per deuteron). This higher energy-per-nucleon leads to a five times higher neutron yield for monoatomic ions in the beam compared to diatomic ions.

While hot cathode type minitrons are extensively used in industry, there are significant drawbacks with the use of these types of apparatus. Hot cathode based apparatus use relatively large amounts of electricity compared to other conventional technology. Hot cathode minitrons also have a reduced life expectancy compared to other conventional apparatus. Hot cathode minitrons require a specific and complex support structure for support of the hot cathode and anode. This specific and complex support structure must be capable of withstanding expected shock and vibration environments.

There is a need to provide a minitron apparatus that uses less amounts of electricity and that is more efficient than conventional apparatus.

There is a further need to provide an apparatus and methods that do not have the drawbacks discussed above, including reduced life expectancy.

There is a further need to provide an apparatus that provides a simplified support structure for components of the minitron as well as having a capability of withstanding expected shock and vibration environments.

There is a still further need to reduce economic costs associated with operations and apparatus described above with conventional tools.

SUMMARY

So that the manner in which the above recited features of the present disclosure can be understood in detail, a more particular description of the disclosure, briefly summarized below, may be had by reference to embodiments, some of which are illustrated in the drawings. It is to be noted that the drawings illustrate only typical embodiments of this disclosure and are therefore not to be considered limiting of its scope, for the disclosure may admit to other equally effective embodiments without specific recitation. Accordingly, the following summary provides just a few aspects of the description and should not be used to limit the described embodiments to a single concept.

In one example embodiment, a method of operating an ion source generating arrangement is disclosed. The method may include providing a microwave energy source, activating the microwave energy source and transmitting microwave energy from the microwave energy source to an ion source region that contains a distributed ground structure. The method may further provide for performing an ionization of a source gas in an ionization region of the arrangement to create ions and transmitting the ions to a target.

In one non-limiting embodiment, an arrangement is disclosed. The arrangement comprises a microwave electromagnetic energy source. The arrangement further comprises an ion source region configured with a housing containing an ionizing gas. The arrangement further comprises a coaxial cable connecting the electromagnetic energy source to the ion source region. The arrangement further comprises an antenna placed within the ion source region. The arrangement further comprises a distributed ground system surrounding the antenna. The arrangement further comprises at least one system of magnets arranged around the ion source region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the drawings. It is to be noted, however, that the appended drawings illustrate only typical embodiments of this disclosure and are therefore not be considered limiting of its scope, for the disclosure may admit to other equally effective embodiments.

Figure 1:
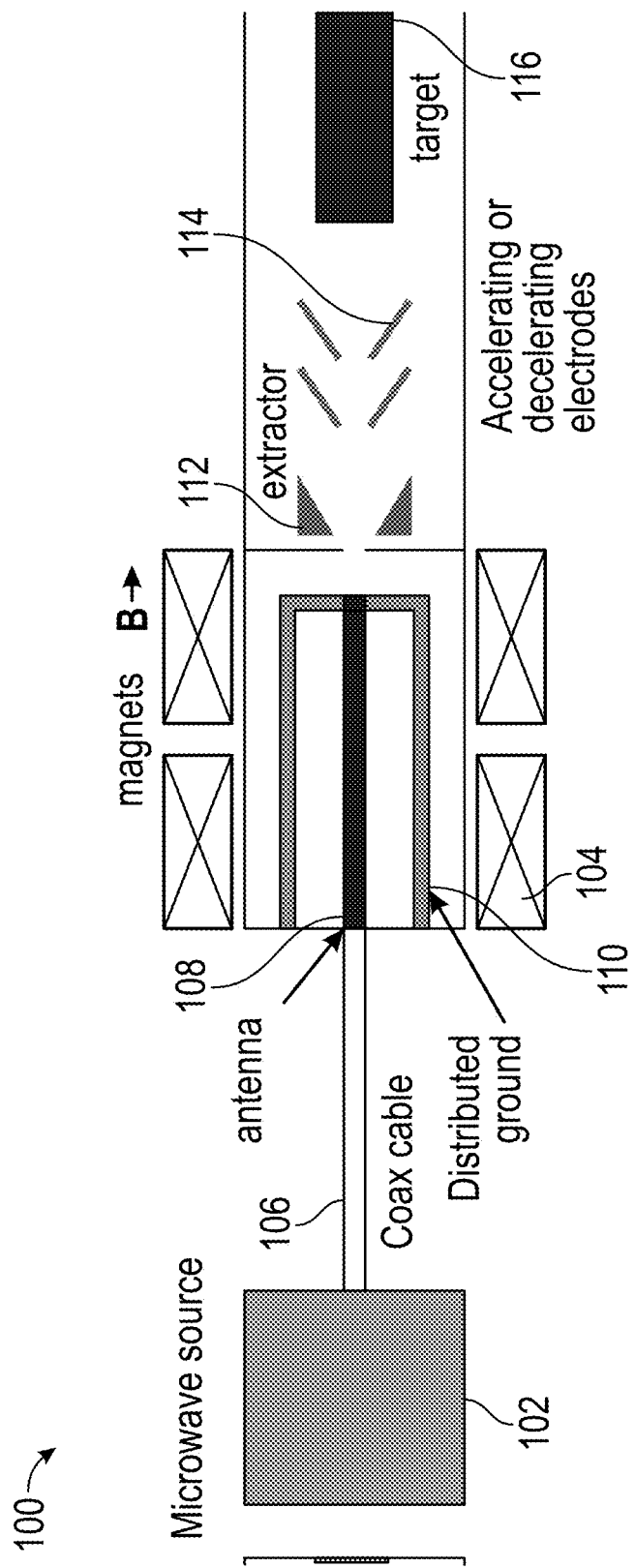
FIG. 1 is a perspective view of an example embodiment of a distributed ground single antenna ion source in one example embodiment of the disclosure.
Figure 2:
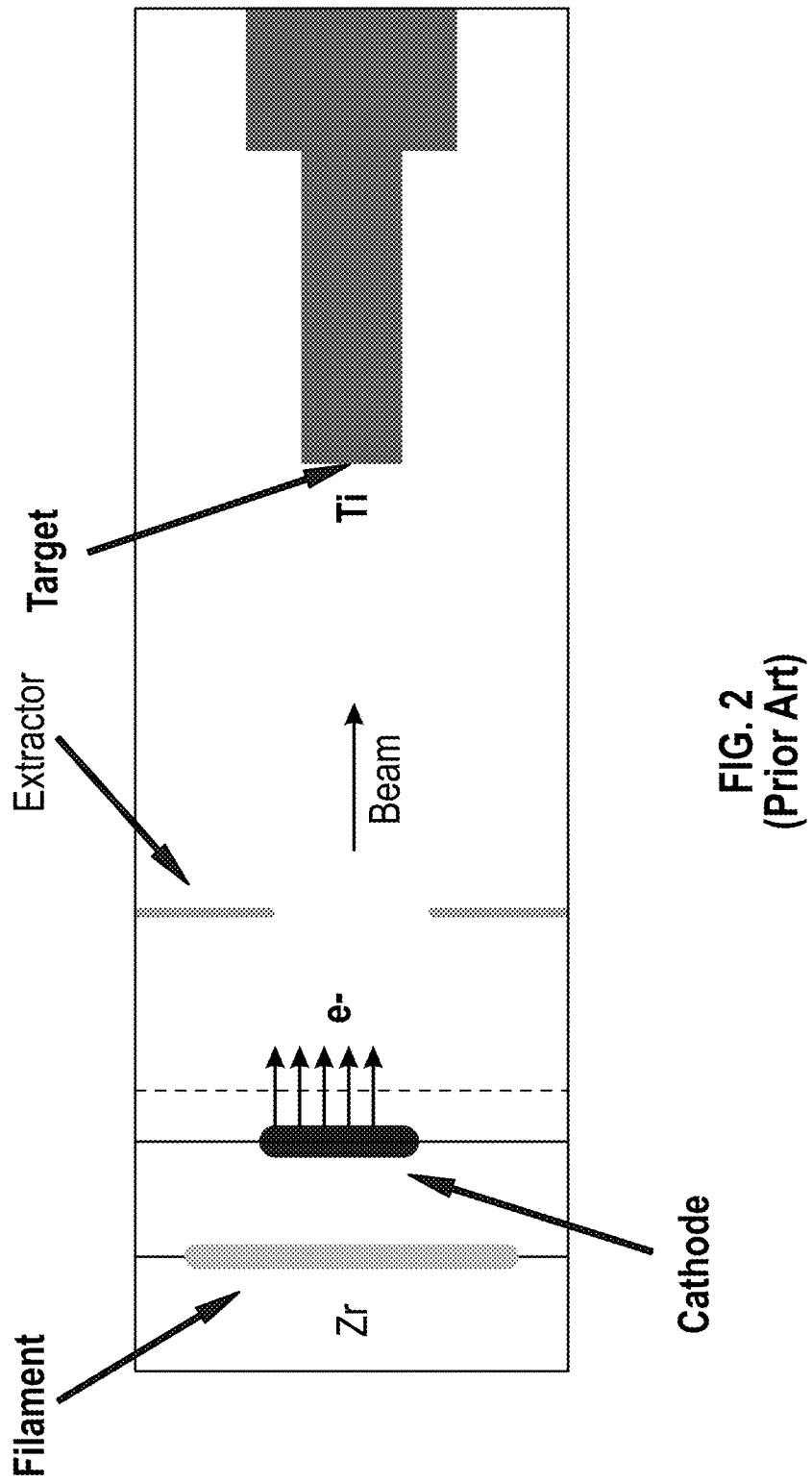
FIG. 2 is a prior art minitron using hot cathode technology.

To facilitate understanding, identical reference numerals have been used, where possible, to designate identical elements that are common to the figures ("FIGS"). It is contemplated that elements disclosed in one embodiment may be beneficially utilized on other embodiments without specific recitation.

DETAILED DESCRIPTION

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the claims except where explicitly recited in a claim. Likewise, reference to "the disclosure" shall not be construed as a generalization of inventive subject matter disclosed herein and should not be considered to be an element or limitation of the claims except where explicitly recited in a claim.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first", "second" and other numerical terms, when used herein, do not imply a sequence or order unless clearly indicated by the context. Thus, a first element, component, region, layer or section discussed herein could be termed a second element, component, region, layer or section without departing from the teachings of the example embodiments.

When an element or layer is referred to as being "on," "engaged to," "connected to," or "coupled to" another element or layer, it may be directly on, engaged, connected, coupled to the other element or layer, or interleaving elements or layers may be present. In contrast, when an element is referred to as being "directly on," "directly engaged to," "directly connected to," or "directly coupled to" another element or layer, there may be no interleaving elements or layers present. Other words used to describe the relationship between elements should be interpreted in a like fashion. As used herein, the term "and/or" includes any and all combinations of one or more of the associated listed terms.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art, that some embodiments may be practiced without many of these details, and that numerous variations or modifications from the described embodiments are possible. As used herein, the terms "above" and "below", "up" and "down", "upper" and "lower", "upwardly" and "downwardly", and other like terms indicating relative positions above or below a given point are used in this description to more clearly describe certain embodiments.

Aspects of the disclosure relate to a method of producing ions in the ion source based on a different technology than the hot cathode minitron, namely ionization via electromagnetic waves, typically in the microwave or rf frequency range. Other aspects of the disclosure relate to the apparatus involved in the minitron itself. In aspects of the disclosure related to the method, aspects of the disclosure produce much higher ionization efficiency, creating higher ion currents, and much higher monoatomic fraction, which produces higher neutron yield.

In the microwave based ion source illustrated in FIG. 1, microwave electromagnetic energy source 102 is provided. The purpose of the microwave electromagnetic energy source 102 is to provide microwave energy to an ion source region that has a housing and contains a distributed ground structure 110 via a single quarter wave antenna 108 which are fed from the microwave energy source 102 (e.g. magnetron, klystron, traveling wave tube (TWT), or solid state power amplifier (SSPA)) as well as an ionizing gas. No waveguide or microwave windows are required for this source. A coaxial cable 106 connects the source 102 to the ion source region.

The ionization mechanism for the microwave ion source region is called electron cyclotron resonance. In one embodiment, a magnetic field is introduced into the microwave ion source region, typically using permanent magnets 104, as illustrated in FIG. 1. In other embodiments, different configurations may be used. Such different configurations may use electromagnetic coils. The permanent magnets 104 can be made of various ferromagnetic materials, such as a Neodymium Iron Boron (NdFeB) magnet or Samarium Cobalt (SmCo), for example. The magnetic field introduces a cyclotron motion in any liberated electrons within the ion source, which is a circular motion around the magnetic field lines with a frequency given by the cyclotron frequency, $$\omega_c = \frac{qB}{m}$$

where q is the electron charge, B is the magnitude of the magnetic field and m is the electron mass. In instances where external electromagnetic waves are produced at this frequency into this environment, a resonant process occurs which efficiently couples microwave power from the electromagnetic wave to the electron transverse momentum. These so-called hot electrons efficiently ionize gas molecules.

Further referring to FIG. 1, electrodes 114 may be used to alter the speed of ions generated and propel the ions toward a target 116. As will be understood, the electrodes 114 may accelerate or decelerate the ions. An extractor 112 may be used to form the ions into a beam for hitting the target 116.

In the embodiments described, a distributed ground structure is used to enhance the field produced by a single live antenna, different than conventional apparatus. Conventional apparatus have sources which feature a single live antenna surrounded by multiple grounded antennas. Here, embodiments disclosed have a single connected ground structure, with a single central live antenna. The design of the ground structure is variable, and depends mainly on the available space and the desired EM mode configuration and resulting plasma spatial extent.

One significant advantage of having a distributed ground structure opposed to multiple grounded antennas, is that the volume over which the peak field is achieved is increased. Another significant advantage is that the transverse dimension of the source is reduced. This increase in peak-field volume and reduction in transverse dimension is enabled by concentrating the electric fields from the live antenna between entire ground structure and the cavity wall. The main advantage of having a distributed ground structure in comparison to a simple cylindrical ground wall is a significant increase in peak electric field strength.

The frequency of the external EM waves and the magnitude of the magnetic field are tuned to create the cyclotron resonance. Typically, the magnetic field is not constant within the region, so that the resonance is spatially localized. In the ion source, the resonance location is tailored so that the resonance location coincides with the peak electric field created by the antennas. This is typically in the region between the tip of the antenna and the ground structure, or between the ground structure and the vacuum walls. Free electrons that pass repeatedly through this resonance region will get excited to higher and higher energies each time, causing further collisional ionizations. The resulting ionization efficiency can be very high, depending on the microwave power used, approaching near 100% for very high powers, meaning that all of the neutral gas has been ionized, creating a plasma. For more moderate powers, the ionization efficiency may be in the 10-50% range.

Commercial microwave sources, typically klystrons, magnetrons or SSPAs, are commonly available at several frequencies, though some are much more prevalent than others. A popular frequency is 2.45 GHz, which corresponds to a resonant magnetic field of 875 Gauss. Many other frequencies and corresponding magnetic fields are possible, from 500 MHz to 100 GHz. This magnetic field value will then need to be created within the ion source region, either by permanent magnets or electromagnetic coils.

Another benefit of the microwave ion source is that the resulting plasma has a high monoatomic fraction, which is important for attaining high neutron yield, as mentioned above.

Once the plasma has been created, the ions must be extracted to form a beam. One can apply a parallel electric field to the axial magnetic field line, to have them preferentially travel out of the ion source toward the acceleration column. This is achieved through a (continuous or pulsed) potential applied to an extractor electrode, similar to the one present in the hot cathode minitron design. In embodiments, the geometry of the ion source region and extractor electrodes may be optimized to maximize the extracted ion current. Examples of particular extraction geometries are accel-accel and accel-decel type electrode configurations. The shapes of these electrodes can vary from a simple flat geometry to a Pierce geometry, which is a conical electrode which compensates for beam space charge by electrostatically focusing the beam.

In contrast to the hot cathode minitron, since the ionization in the microwave ion source is very high, consideration of collisions with neutrals is less of a concern. In addition, these types of ion sources operate at low pressures, such as 0.01-10 mTorr, for example the ions source can operate at 0.01 mTorr, 0.05 mTorr, 0.1 mTorr, 0.15 mTorr, 1 mTorr, 3 mTorr, 6 mTorr, 10 mTorr, which further reduces interactions with gas atoms. Specifically, charge exchange collisions of ions with neutrals is a very common occurrence which would mostly be eliminated in these sources. These types of interactions are deleterious and damaging to the source and seriously degrade their lifetimes, thus eliminating them is advantageous.

Very high ion beam currents may be generated using the embodiments disclosed. Depending on the input power, which could range from 1 W to 100 W, beam current densities in the range of 1-100 mA/cm$^2$ are possible. For example, a moderate value of 50 mA/cm$^2$ corresponds to a beam current above 100 mA, compared to the 100 uA currently used in the hot cathode minitron. In such a configuration, generation capability can exceed above $10^{11}$ neutrons/second. Typically, such a source would be operated at much lower powers, to take advantage of its efficiency. For example, run at 1W, one could expect beam currents ranging from 0.5-5 mA. The beam currents can be operated with any beam current, for example, the beam current can be from about 0.01 mA to about 10 mA, e.g., the beam current can be 0.1 mA, 0.5 mA, 1 mA, 2 mA, 3 mA, 6 mA, or 10 mA.

In embodiments, power for this source can be delivered by microwave vacuum tubes, such as klystrons, magnetrons or traveling wave tubes. In high temperature and/or compact environments, solid state power amplifiers are attractive options. SSPAs based on Gallium Nitride (GaN), Silicon Carbide, (SiC), or Gallium Arsenide (GaAs), for example, are suitable options, though there are other possibilities as well. Solid state units, at these frequencies and powers, for example, may be economically used.

Figure 3:
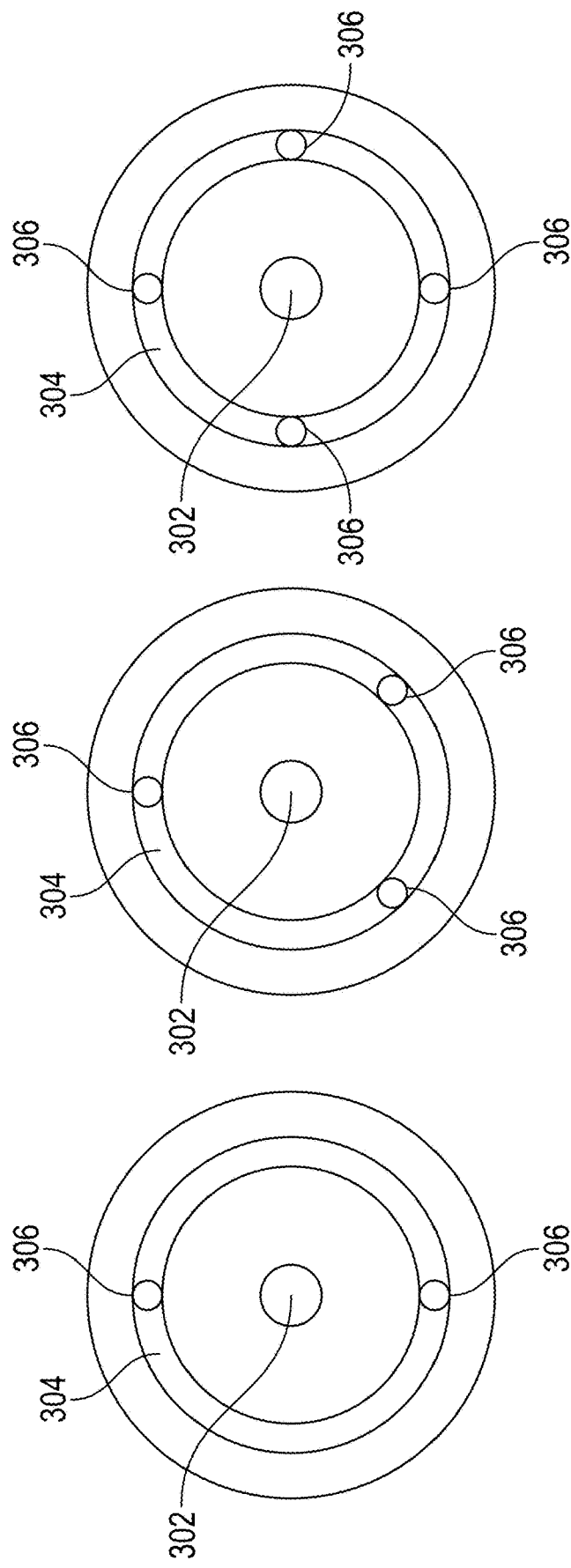
FIG. 3 are embodiments of design structures for use with the distributed ground single antenna ion source, as described in relation to FIG. 1.
Figure 4:
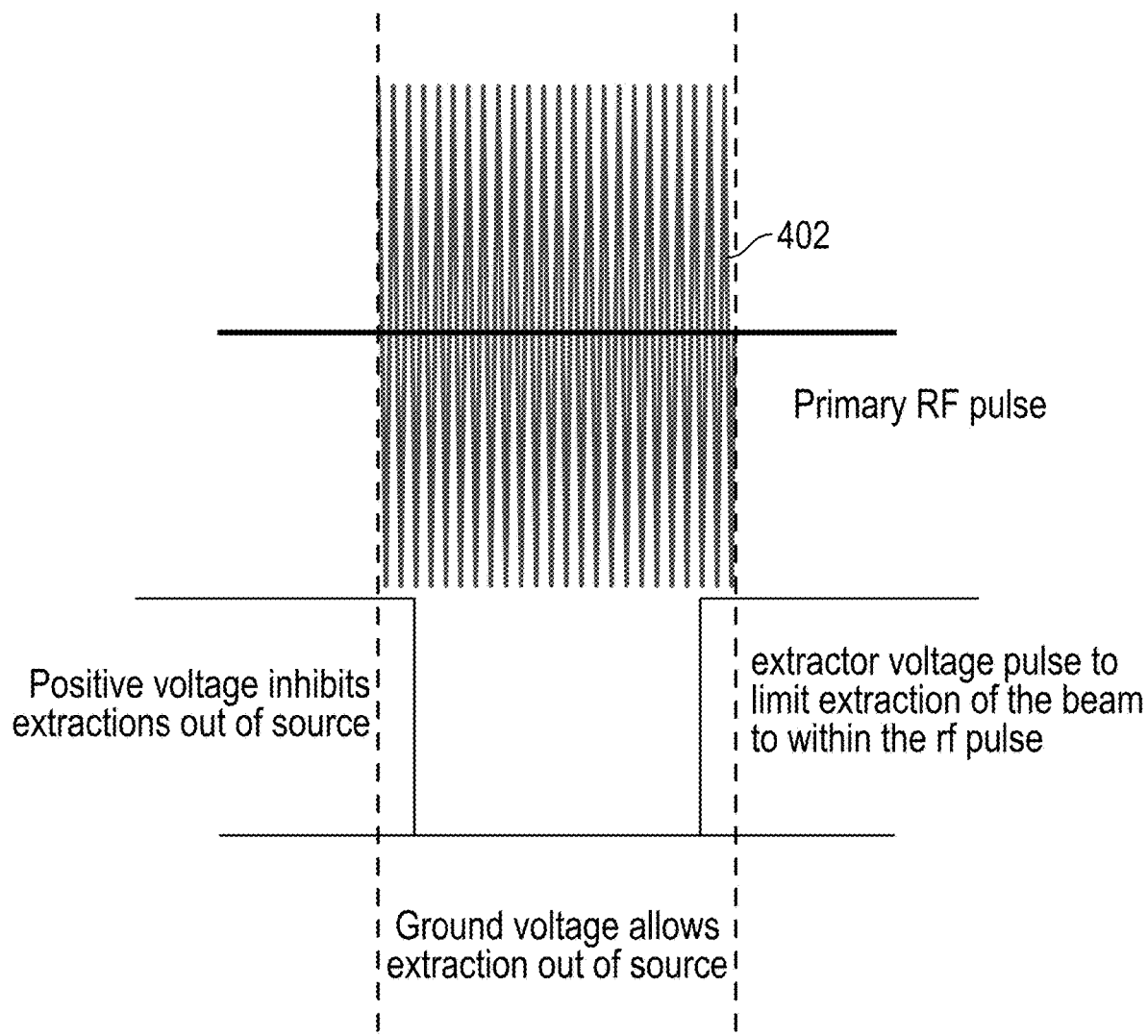
FIG. 4 is a required voltage scheme in relation for biased extraction in one non-limiting example embodiment of the disclosure.
Figure 5:
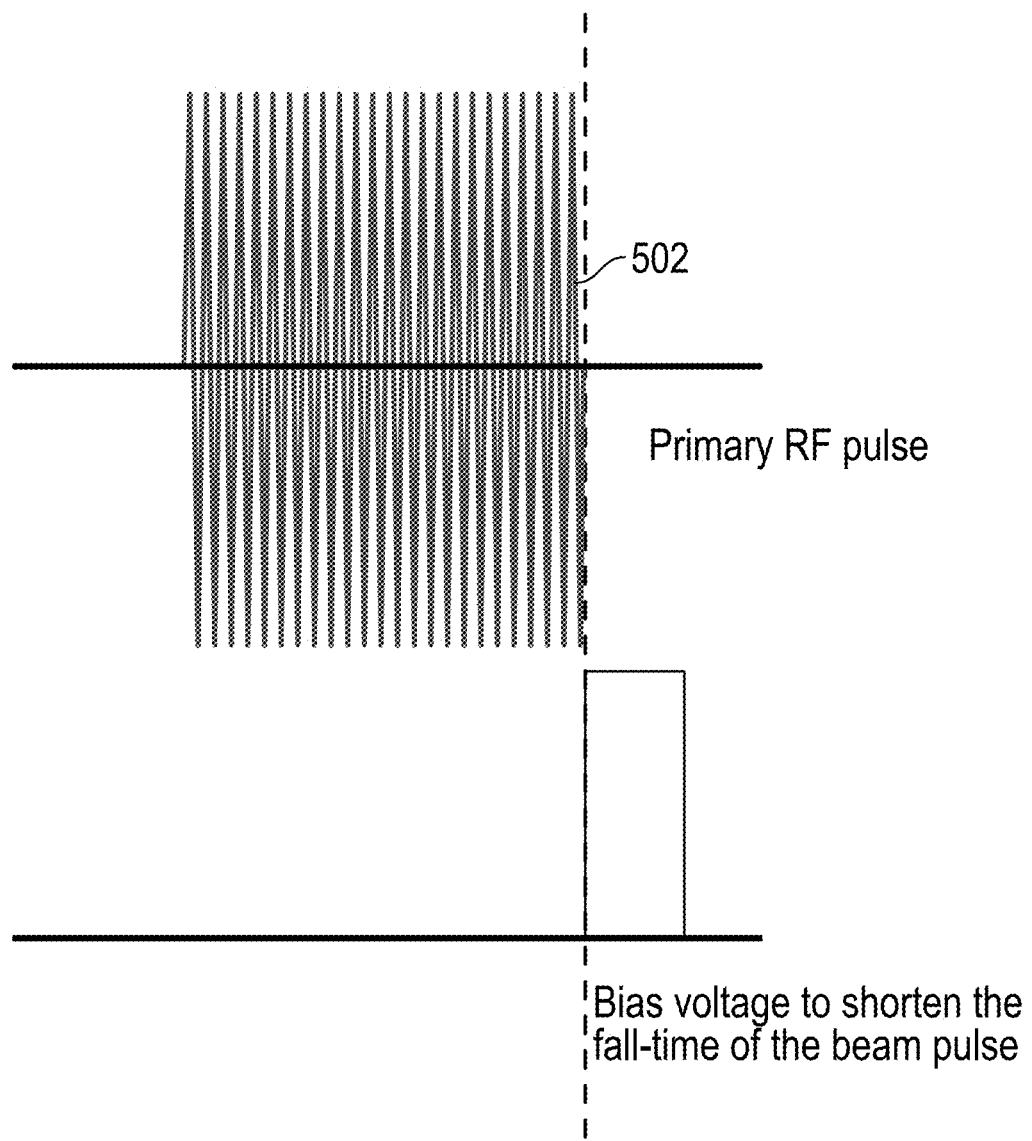
FIG. 5 is a required voltage scheme for using a bias voltage to sharply cut off the beam of FIG. 1.

Whether the microwave power source is vacuum tube based or solid state, aspects of the disclosure can be operated in a pulsed mode or continuous wave. Pulsing of this source can be achieved either by pulsing of the primary RF pulse alone, or by use of a biased extractor separating the plasma from the extraction potential. By biasing this extractor to a small positive voltage, beam extraction can be suppressed even when plasma is present. The use of a biased extractor allows for very rapid rise and fall times of the resulting neutron output. Examples of the distributed ground system are provided in relation to FIG. 3. In such embodiments, the live antenna 302 may be surrounded by an extended ground 304 with supporting structures 306. The required voltage scheme 402 for biased extraction is shown in FIG. 4. In another example embodiment, it is also possible to use a biasing potential only at the end of the RF pulse at 502 to sharply cut off the beam, as shown in FIG. 5.

Figure 6:
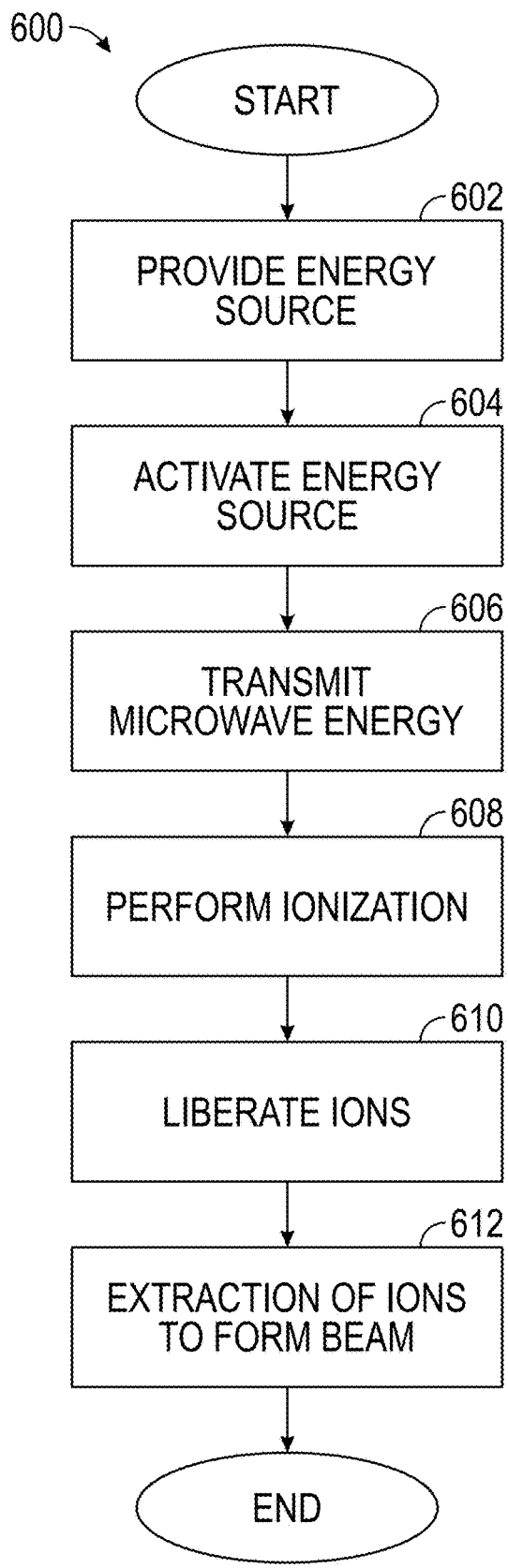
FIG. 6 is a method of operating a distributed ground single antenna ion source.

Referring to FIG. 6, a method 600 to operate a distributed ground single antenna ion source is described. The method 600 entails providing a microwave electromagnetic energy source at 602. At 604, the method provides for activating the microwave electromagnetic energy source. At 606, the method further provides for transmitting microwave energy generated by the microwave electromagnetic energy source to an ion source region that contains a distributed ground structure. In embodiments, a single quarter wave antenna may be used. At 608 the method may further proceed with performing an ionization. In one embodiment, the ionization may be produced by electron cyclotron resonance. In this embodiment, permanent magnets create a magnetic field in the source region. In another example embodiment, electromagnetic coils may be used to create the magnetic field in the source region. At 610, ions are liberated within the ion source. At 612, the method progresses and the ions are extracted to form a beam and transmitted toward a target. In one example embodiment, liberated ions travel in a circular motion around magnetic field lines with a frequency given by a cyclotron frequency.

As will be understood, the microwave power source may be a magnetron, klystron, traveling wave tube (TWT), or solid state power amplifier (SSPA).

Embodiments described herein provide for a minitron apparatus that uses less amounts of electricity and that is more efficient than conventional apparatus.

Embodiments described herein provide an apparatus and methods that do not have the drawbacks discussed above, including reduced life expectancy.

Embodiments described herein provide a simplified support structure for components of the minitron as well as having a capability of withstanding expected shock and vibration environments.

Embodiments described herein provide reduced economic costs associated with operations and apparatus described above with conventional tools.

In one example embodiment, a method of operating an ion source generating arrangement is disclosed. The method may include providing a microwave energy source, activating the microwave energy source and transmitting microwave energy from the microwave energy source to an ion source region that contains a distributed ground structure. The method may further provide for performing an ionization of a source gas in an ionization region of the arrangement to create ions and transmitting the ions to a target.

In another example embodiment, the method may be performed wherein the transmitting the microwave energy is performed through a use of an antenna.

In another example embodiment, the method may be performed wherein the antenna is a quarter wave antenna.

In another example embodiment, the method may be performed wherein the antenna is a single antenna.

In another example embodiment, the method may be performed wherein the ionization of the source gas is through electron cyclotron resonance.

In another example embodiment, the method may be performed wherein the transmitting the ions to the target occurs in a substantially straight motion.

In another example embodiment, the method may be performed wherein the circular motion occurs around magnetic field lines with a frequency given by a cyclotron frequency.

In another example embodiment, the method may be performed wherein the microwave energy source is one of a magnetron, klystron, traveling wave tube, and solid state power amplifier.

In another example embodiment, the method may be performed wherein the activating the microwave energy source is in a pulsed mode.

In another example embodiment, the method may be performed wherein the pulsed mode is achieved through action of a biased extractor.

In another example embodiment, the method may be performed wherein the activing the microwave energy source is performed in a continuous wave mode.

In another example embodiment, the method further comprises extracting ions to form a beam and transmitting the beam toward a target.

In one non-limiting embodiment, an arrangement is disclosed. The arrangement comprises a microwave electromagnetic energy source. The arrangement further comprises an ion source region configured with a housing containing an ionizing gas. The arrangement further comprises a coaxial cable connecting the electromagnetic energy source to the ion source region. The arrangement further comprises an antenna placed within the ion source region. The arrangement further comprises a distributed ground system surrounding the antenna. The arrangement further comprises at least one system of magnets arranged around the ion source region.

In another example embodiment, the arrangement may further comprise an extractor configured to take ions produced in the ion source region and form the ions into a beam.

In another example embodiment, the arrangement may further comprise at least one set of electrodes configured to receive the beam produced by the extractor and at least one of accelerate and decelerate the ions within the beam.

In another example embodiment, the arrangement may be configured wherein the microwave electromagnetic energy source is one of a magnetron, klystron, traveling wave tube and solid state power amplifier.

In another example embodiment, the arrangement may be configured wherein the magnets are permanent magnets.

In another example embodiment, the arrangement may be configured wherein the microwave electromagnetic energy source is a solid-state power amplifier based on one of gallium nitride, silicon carbide and gallium arsenide.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may be varied in many ways. Such variations are not to be regarded as a departure from the disclosure, and all such modifications are intended to be included within the scope of the disclosure.

While embodiments have been described herein, those skilled in the art, having benefit of this disclosure, will appreciate that other embodiments are envisioned that do not depart from the inventive scope. Accordingly, the scope of the present claims or any subsequent claims shall not be unduly limited by the description of the embodiments described herein.

What is claimed is:

1. A method of operating an ion source generating arrangement, comprising:
   providing a microwave energy source;
   activating the microwave energy source;
   transmitting microwave energy from the microwave energy source to an ion source region using an antenna, wherein the ion source region contains a cylindrical distributed ground structure surrounding the antenna;
   performing an ionization of a source gas in an ionization region of the arrangement to create ions; and
   transmitting the ions to a target.

2. The method according to claim 1, further comprising applying a parallel electric field during the extracting created ions to propel the ions to an acceleration column.

3. The method according to claim 1, wherein the antenna is a quarter wave antenna.

4. The method according to claim 3, wherein the antenna is a single antenna.

5. The method according to claim 1, wherein the ionization of the source gas is through electron cyclotron resonance.

6. The method according to claim 1, wherein the transmitting the ions to the target occurs in a substantially straight path.

7. The method according to claim 6, wherein the circular motion occurs around magnetic field lines with a frequency given by a cyclotron frequency.

8. The method according to claim 1, wherein the microwave energy source is one of a magnetron, klystron, traveling wave tube, and solid state power amplifier.

9. The method according to claim 1, wherein the activating the microwave energy source is in a pulsed mode.

10. The method according to claim 9, wherein the pulsed mode is achieved through action of a biased extractor.

11. The method according to claim 1, wherein the activating the microwave energy source is performed in a wave mode.

12. The method according to claim 11, wherein the wave mode is a continuous wave mode.

13. The method according to claim 1, further comprising:
    extracting created ions to form an ion beam; and
    transmitting the beam toward the target.

14. An arrangement, comprising:
    a microwave electromagnetic energy source;
    an ion source region configured with a housing that contains an ionizing gas;
    a coaxial cable connecting the electromagnetic energy source to the ion source region;
    an antenna placed within the housing of the ion source region;
    a cylindrical distributed ground structure disposed within the housing and surrounding the antenna; and
    at least one system of magnets arranged around the ion source region.

15. The arrangement according to claim 14, wherein the magnets are permanent magnets.

16. The arrangement according to claim 14, further comprising:
    an extractor configured to take ions produced in the ion source region and form the ions into a beam.

17. The arrangement according to claim 16, further comprising:
    at least one set of electrodes configured to receive the beam produced by the extractor and at least one of accelerate and decelerate the ions within the beam.

18. The arrangement according to claim 14, wherein the microwave electromagnetic energy source is one of a magnetron, klystron, traveling wave tube and solid state power amplifier.

19. The arrangement according to claim 15, wherein the microwave electromagnetic energy source is a solid-state power amplifier based on one of gallium nitride, silicon carbide and gallium arsenide.

\* \* \* \* \*